(12) United States Patent
Zhou

(10) Patent No.: US 12,160,083 B2
(45) Date of Patent: Dec. 3, 2024

(54) LASER DIODE DRIVE CIRCUIT AND LIDAR

(71) Applicant: SUTENG INNOVATION TECHNOLOGY CO., LTD., Shenzhen (CN)

(72) Inventor: Xiaojun Zhou, Shenzhen (CN)

(73) Assignee: SUTENG INNOVATION TECHNOLOGY CO., LTD., Shenzhen (CN)

( * ) Notice: Subject to any disclaimer, the term of this patent is extended or adjusted under 35 U.S.C. 154(b) by 14 days.

(21) Appl. No.: 18/217,607

(22) Filed: Jul. 2, 2023

(65) Prior Publication Data
US 2024/0014629 A1  Jan. 11, 2024

(30) Foreign Application Priority Data
Jul. 5, 2022 (CN) .......................... 202210785674.1

(51) Int. Cl.
 H01S 5/042  (2006.01)
 G01S 7/484  (2006.01)
 H01S 5/068  (2006.01)

(52) U.S. Cl.
 CPC ............ *H01S 5/0428* (2013.01); *G01S 7/484* (2013.01); *H01S 5/06812* (2013.01)

(58) Field of Classification Search
 CPC .................................................. H01S 5/06812
 See application file for complete search history.

(56) References Cited

U.S. PATENT DOCUMENTS

| | | | |
|---|---|---|---|
| 2011/0085576 A1* | 4/2011 | Crawford | H05B 45/38 372/38.07 |
| 2018/0109074 A1* | 4/2018 | Gassend | H01S 5/06817 |
| 2022/0166322 A1* | 5/2022 | Russell | H01S 5/4025 |

* cited by examiner

*Primary Examiner* — Tuan N Nguyen
(74) *Attorney, Agent, or Firm* — BAYES PLLC

(57) ABSTRACT

Embodiments of this application disclose a laser diode drive circuit and a LiDAR. The laser diode drive circuit includes a laser diode and a charging and discharging circuit. A cathode of the laser diode is grounded. The charging and discharging circuit is in a one-to-one correspondence with the laser diode, and includes an energy storage element, a first switch element, and a second switch element. The energy storage element is connected to an anode of the laser diode via the first switch element, and the energy storage element is grounded via the first switch element and the second switch element in sequence.

8 Claims, 8 Drawing Sheets

LASER DIODE DRIVE CIRCUIT AND LIDAR

CROSS-REFERENCE TO RELATED APPLICATION

The present application claims the benefit of priority to Chinese Patent Application No. 202210785674.1, filed on Jul. 5, 2022, which is hereby incorporated by reference in its entirety.

TECHNICAL FIELD

This application relates to the field of laser technologies, and in particular, to a laser diode drive circuit and a LiDAR.

BACKGROUND

A capacitor is discharged to drive a laser diode to emit a laser beam, and the capacitor needs to be charged before the capacitor is discharged. During charging of the capacitor, a leakage current flows through the laser diode, thereby causing false light emission for the laser diode.

SUMMARY

Embodiments of this application provide a laser diode drive circuit and a LiDAR, so that a leakage current can be released to a ground during charging of a capacitor, thereby effectively preventing light interference caused because the leakage current drives a laser diode to falsely emit a laser beam to a target detected object.

According to a first aspect, embodiments of this application provide a laser diode drive circuit, where the laser diode drive circuit includes a laser diode and a charging and discharging circuit, a cathode of the laser diode is grounded, the charging and discharging circuit is in a one-to-one correspondence with the laser diode, each charging and discharging circuit includes an energy storage element, a first switch element, and a second switch element, the energy storage element is connected to an anode of the laser diode via the first switch element, and the energy storage element is grounded via the first switch element and the second switch element in sequence, where when the energy storage element is charged, the first switch element is turned off and the second switch element is turned on, so that a leakage current flowing through the first switch element is released via the second switch element; or when the energy storage element is discharged, the first switch element is turned on and the second switch element is turned off, so that energy released from the energy storage element flows through the first switch element to drive the laser diode to emit a laser beam.

Based on the laser diode drive circuit in embodiments of this application, during the charging of the energy storage element, the first switch element is turned off and the second switch element is turned on, and the leakage current flowing through the first switch element can be released to the ground via the second switch element, thereby effectively preventing light interference caused because the leakage current drives the laser diode to emit a laser beam to a target detected object. During the discharging of the energy storage element, the first switch element is turned on and the second switch element is turned off, the energy storage element releases energy to the laser diode via the first switch element, and the energy is sufficient to drive the laser diode to emit a laser beam to the target detected object, thereby ensuring normal operation of the laser diode.

According to a second aspect, embodiments of this application provide a LiDAR, where the LiDAR includes a laser beam detection circuit and the foregoing laser diode drive circuit, and the laser beam detection circuit is capable of receiving a laser beam that is emitted by the laser diode drive circuit and that is reflected by a target detected object.

Based on the LiDAR in embodiments of this application, the LiDAR having the foregoing laser diode drive circuit can ensure that a leakage current is released to a ground during charging of the energy storage element, thereby effectively preventing the light interference caused because the leakage current drives the laser diode to emit the laser beam to the target detected object.

BRIEF DESCRIPTION OF DRAWINGS

To describe the technical solutions in the embodiments of this application more clearly, the following briefly describes the accompanying drawings. Apparently, the accompanying drawings in the following description show merely some embodiments of this application.

REFERENCE SIGNS

Figure 1:
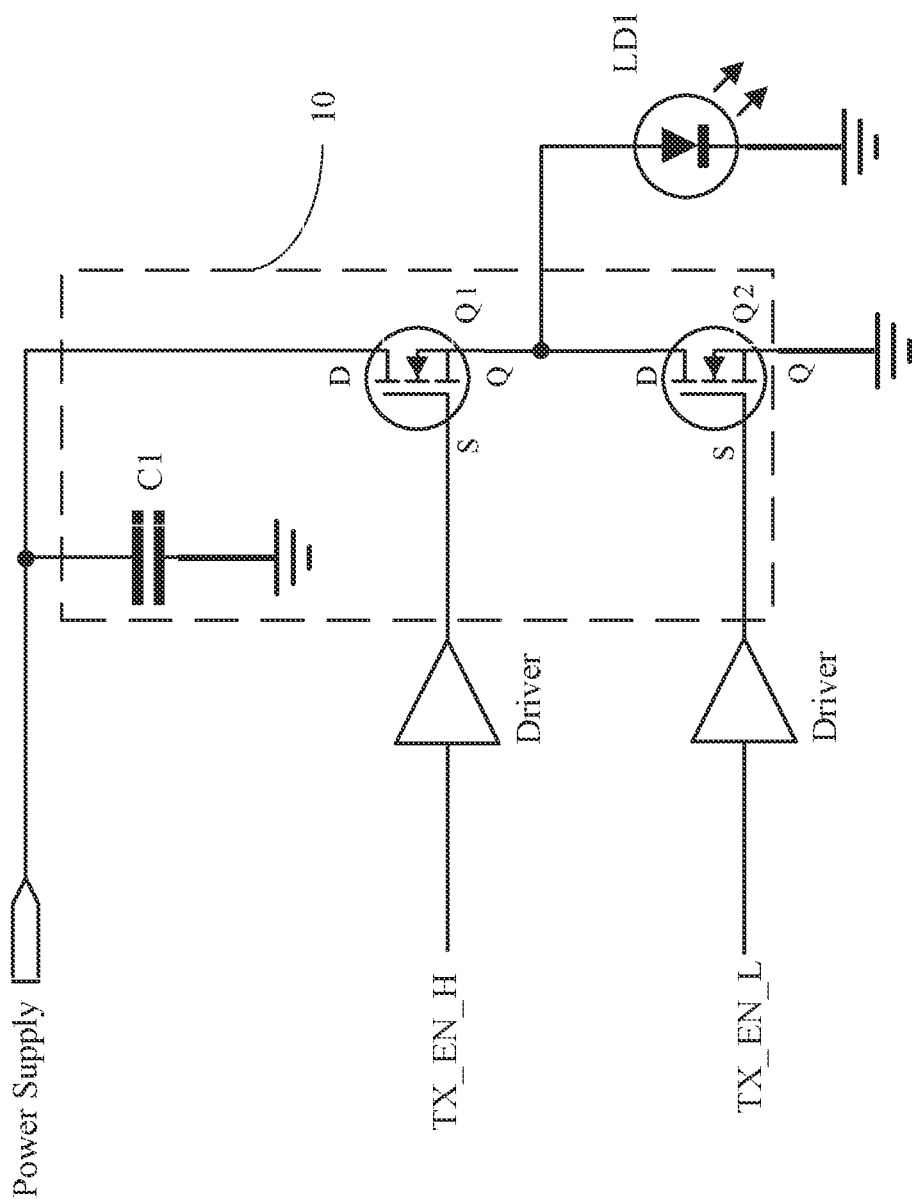
FIG. 1 is a schematic circuit diagram of a laser diode drive circuit according to an embodiment of this application.

1—laser diode drive circuit; LD1—laser diode; 10—charging and discharging circuit; Q1—first switch element; Q2—second switch element; C1—energy storage element; Driver—driver; S—control terminal; D—input terminal; Q—output terminal; C2—bootstrap capacitor; D2—second diode; VCC—drive power supply; 20—energy charging circuit; L1—energy storage inductor; D1—first diode; Q3—third switch element; Power1Supply—external power supply; Q4—fourth switch element; R1—current limiting resistor; TX_EN_H—first trigger signal; TX_EN_L—second trigger signal; CHG_EN—third trigger signal; time1—first dead time; time2—second dead time; and time3—third dead time.

DETAILED DESCRIPTION

To make the objectives, technical solutions, and advantages of this application clearer, the following further describes the embodiments of this application in detail with reference to the accompanying drawings.

When the following description relates to the accompanying drawings, unless otherwise specified, the same numbers in different accompanying drawings represent the same or similar elements. Implementations described in the following exemplary embodiments do not represent all the implementations consistent with those in this present application. On the contrary, the implementations are only examples of apparatuses and methods that are described in the appended claims in detail and that are consistent with some aspects of this application.

In the descriptions of the present application, it shall be understood that the terms such as "first" and "second" are merely intended for the purpose of description, and shall not be understood as an indication or implication of relative importance. The person skilled in the art can understand specific meanings of the foregoing terms in the present application to a specific situation. In addition, in the descriptions of the present application, "a plurality of" means two or more unless otherwise specified. Herein, "and/or" is an association relationship for describing associated objects and indicates that three relationships may exist. For example, A and/or B may mean the following three cases: only A exists, both A and B exist, and only B exists. The character "/" generally indicates an "or" relationship between the associated objects.

Unless otherwise defined, all technical and scientific terms used herein shall have the same meanings as those commonly understood by a person skilled in the art to which this application pertains. The terms used in this specification are only used to describe a purpose of specific embodiments, but are not intended to limit this application. The term "and/or" used herein includes any and all combinations of one or more related listed items.

A capacitor is discharged to drive a laser diode to emit a laser beam, and the capacitor needs to be charged before the capacitor is discharged. During charging of the capacitor, a leakage current flows through the laser diode, thereby causing false light emission for the laser diode.

To resolve the foregoing technical problem, referring to FIG. 1, a first aspect of this application provides a laser diode drive circuit 1, so that a leakage current of a first switch element Q1 can be released to a ground, thereby effectively preventing light interference caused because the leakage current drives a laser diode LD1 to emit a laser beam to a target detected object.

The laser diode drive circuit 1 includes a laser diode LD1 and a charging and discharging circuit 10, a cathode of the laser diode LD1 is grounded, the charging and discharging circuit 10 is in a one-to-one correspondence with the laser diode LD1, each charging and discharging circuit 10 includes an energy storage element C1, a first switch element Q1, and a second switch element Q2, the energy storage element C1 is connected to an anode of the laser diode LD1 via the first switch element Q1, and the energy storage element C1 is grounded via the first switch element Q1 and the second switch element Q2 in sequence, where when the energy storage element C1 is charged, the first switch element Q1 is turned off and the second switch element Q2 is turned on, so that a leakage current flowing through the first switch element Q1 is released via the second switch element Q2; or when the energy storage element C1 is discharged, the first switch element Q1 is turned on and the second switch element Q2 is turned off, so that energy released from the energy storage element C1 flows through the first switch element Q1 to drive the laser diode LD1 to emit a laser beam.

An exemplary circuit structure of the laser diode drive circuit 1 is introduced below with reference to FIG. 1 to FIG. 8. The laser diode drive circuit 1 includes a laser diode LD1 and a charging and discharging circuit 10.

As shown in FIG. 1, the laser diode LD1 is used as a component for emitting a laser beam to the target detected object. The laser diode LD1 belongs to a type of light emitting diode. A laser beam emitted by the laser diode LD1 has good directivity and a relatively single spectral line. The laser diode LD1 also has characteristics of a forward turn-on state and a reverse turn-off state of the light emitting diode. That is, when an anode voltage of the laser diode LD1 is higher than a cathode voltage of the laser diode LD1, and a voltage difference between the anode voltage of the laser diode LD1 and the cathode voltage of the laser diode LD1 is greater than a turn-on threshold of the laser diode LD1, the laser diode LD1 is in the foregoing forward turn-on state; or when the voltage difference between the anode voltage of the laser diode LD1 and the cathode voltage of the laser diode LD1 is less than the turn-on threshold of the laser diode LD1, the laser diode LD1 is in the turn-off state.

The cathode of the laser diode LD1 is grounded.

The charging and discharging circuit 10 is used as a circuit structure for storing energy provided by an external power supply and providing energy to the laser diode LD1, that is, the charging and discharging circuit 10 can not only be configured to receive and store the energy provided by the external power supply, but also provide energy to the laser diode LD1, so that the laser diode LD1 emits a laser beam to the target detected object.

The charging and discharging circuit 10 is in a one-to-one correspondence with the laser diode LD1. That is, when there is one laser diode LD1, there is also one charging and discharging circuit 10; or when there are multiple (more than two) laser diodes LD1, there are also multiple charging and discharging circuits 10, and the number of charging and discharging circuits 10 is equal to the number of laser diodes LD1.

Each charging and discharging circuit 10 includes an energy storage element C1, a first switch element Q1, and a second switch element Q2.

The energy storage element C1 can not only receive the energy provided by the external power supply, but also provide the energy to the laser diode LD1. The energy storage element C1 has a function of storing energy temporarily. The energy storage element C1 temporarily stores the energy provided by the external power supply, and when the laser diode LD1 needs to be driven to emit light, the energy storage element C1 provides the energy to the laser diode LD1. An exemplary manifestation form of the energy storage element C1 is introduced below.

The first switch element Q1 is used as a component to control whether the energy storage element C1 is connected to the laser diode LD1, and the energy storage element C1 is connected to the anode of the laser diode LD1 via the first switch element Q1. The first switch element Q1 may be an electronic switch, for example, a triode, a MOS transistor, or an electronic switch formed by combining the triode and the MOS transistor. An exemplary manifestation form of the first switch element Q1 is introduced below.

The second switch element Q2 is used as a component to control whether the first switch element Q1 is connected to a ground terminal (that is, a port connected to a ground wire in the laser diode drive circuit 1). The energy storage element C1 is grounded (that is, connected to the preceding ground terminal) via the first switch element Q1 and the second switch element Q2 in sequence. The second switch element Q2 may be an electronic switch, for example, a triode, a MOS transistor, or an electronic switch formed by combining the triode and the MOS transistor. An exemplary manifestation form of the second switch element Q2 is introduced below.

When the energy storage element C1 is discharged, the first switch element Q1 is turned on and the second switch element Q2 is turned off, so that the energy (that is, energy that drives the laser diode LD1 to normally emit a laser beam to the target detected object) released by the energy storage element C1 flows through the first switch element Q1 to drive the laser diode LD1 to emit the laser beam. That is, when the energy storage element C1 provides energy to the laser diode LD1, the first switch element Q1 is turned on, and therefore, the energy storage element C1 is connected to the laser diode LD1, so that the energy storage element C1 releases energy to the laser diode LD1 via the first switch element Q1; and the energy is sufficient to drive the laser diode LD1 to emit a laser beam to the target detected object. In addition, the second switch element Q2 is turned off, and therefore, the first switch element Q1 is disconnected from the ground terminal, so that the energy released by the energy storage element C1 can only flow through the first switch element Q1 instead of flowing through the second switch element Q2 to the ground terminal, so that the energy released when the energy storage element C1 is discharged can flow to the laser diode LD1 quickly, thereby driving the laser diode LD1 to emit a laser beam in a form of pulses.

When the energy storage element C1 is charged, the first switch element Q1 is turned off and the second switch element Q2 is turned on, so that the leakage current flowing through the first switch element Q1 is released via the second switch element Q2 (the leakage current is generated because the first switch element Q1 has parasitic capacitance, and therefore, when the energy storage element C1 is charged, a small amount of energy flows through the parasitic capacitance of the first switch element Q1 to form the foregoing leakage current). That is, when the energy storage element C1 receives the energy provided by the external power supply, the second switch element Q2 is turned on, and therefore, the first switch element Q1 is connected to the ground terminal, so that the leakage current flowing through the parasitic capacitance of the first switch element Q1 is released to the ground terminal, thereby effectively preventing light interference caused because the leakage current drives the laser diode LD1 to falsely emit a laser beam. In addition, the first switch element Q1 is turned off, and therefore, the energy storage element C1 is disconnected from the laser diode LD1, so that the energy storage element C1 stops releasing energy to the laser diode LD1. That is, the energy storage element C1 is in an energy storage stage at this time.

Regardless of whether the energy storage element C1 is in a discharging state or a charging state, the first switch element Q1 and the second switch element Q2 cannot be turned on simultaneously.

Based on the laser diode drive circuit 1 in this embodiment of this application, during the charging of the energy storage element C1, the first switch element Q1 is turned off and the second switch element Q2 is turned on, and the leakage current flowing through the first switch element Q1 can be released to the ground via the second switch element Q2, thereby effectively preventing light interference caused because the leakage current drives the laser diode LD1 to falsely emit a laser beam to a target detected object. During the discharging of the energy storage element C1, the first switch element Q1 is turned on and the second switch element Q2 is turned off, the energy storage element C1 releases energy to the laser diode LD1 via the first switch element Q1, and the energy is sufficient to drive the laser diode LD1 to emit a laser beam to the target detected object, thereby ensuring normal operation of the laser diode LD1.

Figure 2:
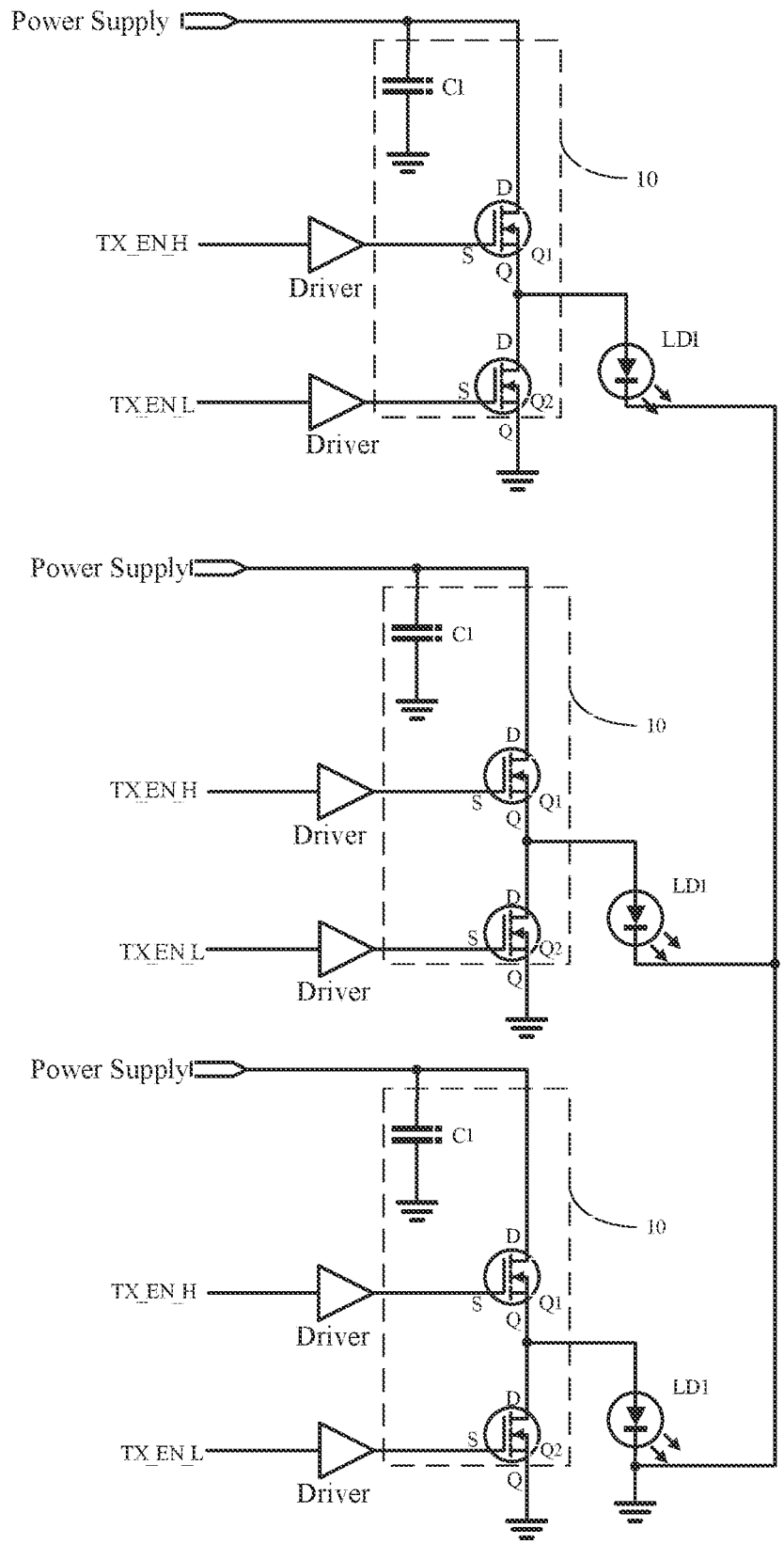
FIG. 2 is a schematic circuit diagram of a cathode-shared laser according to an embodiment of this application.

As shown in FIG. 2, multiple laser diodes LD1 form multiple cathode-shared lasers, and each cathode-shared laser includes multiple cathode-shared laser diodes LD1. Herein, for different cathode-shared lasers, numbers of laser diodes LD1 included in the cathode-shared lasers may be the same or different. In addition, for the same cathode-shared laser, cathodes of all the laser diodes LD1 are connected in parallel (that is, connected to the same point). The cathode-shared laser includes multiple connected laser diodes LD1 with a shared cathode. When the cathode-shared laser emits a laser beam to the target detected object, the laser beam is a pulsed laser beam. That is, all the laser diodes LD1 in the cathode-shared laser emit laser beams to the target detected object successively, and a time interval between successive light emissions of two adjacent laser diodes LD1 is very short (generally nanosecond level). Because it takes some time for the first switch element Q1 connected to the anode of each laser diode LD1 to switch from the turn-off state to the turn-on state, and it also takes some time for the external power supply to charge the energy storage element C1 connected to the anode of the laser diode LD1 via the first switch element Q1 after the energy storage element C1 is discharged, with such design, multiple laser diodes LD1 can be individually controlled, and tens of nanoseconds after almost all energy storage elements C1 are fully charged simultaneously, the laser diode LD1 is driven via discharging, thereby effectively improving resolution of the laser emitter and achieving a purpose of reducing a volume of the LiDAR.

As shown in FIG. 1, in consideration that the energy storage element C1 can not only be used to store the energy provided by the external power supply, but also provide energy to the laser diode LD1 to drive the laser diode LD1 to emit a laser beam to the target detected object, in order that the energy storage element C1 has a corresponding function, an energy storage element C1 including an energy storage capacitor is designed, a first electrode plate of the energy storage capacitor is connected to the first switch element Q1, and a second electrode plate of the energy storage capacitor is grounded. When the first electrode plate and the second electrode plate of the energy storage capacitor have a specific amount of electric charges, a specific voltage UC is generated between the first electrode plate and the second electrode plate of the energy storage capacitor. Because capacity QC of the energy storage capacitor is a constant, when the capacity QC is equal to 0, the voltage UC is equal to 0, and the voltage UC increases along with the capacity QC. A charging process of the energy storage capacitor is essentially an accumulation process of electric charges on the first electrode plate and the second electrode plate of the energy storage capacitor, a discharge process of the energy storage capacitor is essentially a dissipation process of the electric charges on the first electrode plate and the second electrode plate of the energy storage capacitor, and because a change in the amount of electric charges takes some time, charging and discharging of the energy storage capacitor also takes some time.

In consideration that connection and disconnection of the energy storage capacitor and the laser diode LD1 can be controlled via switching between the turn-on state and the turn-off state of the first switch element Q1, similarly, connection and disconnection of the first switch element Q1 and the ground terminal can also be implemented via switching between the turn-on state and the turn-off state of the second switch element Q2, and switching between the turn-on state and the turn-off state of at least one of the first switch element Q1 and the second switch element Q2 can be implemented via, for example, pressing or electronic control. To facilitate control of the switching between the turn-on state and the turn-off state of the first switch element Q1 and the second switch element Q2, the first switch element Q1 and the second switch element Q2 both including an input terminal D, an output terminal Q. and a control terminal S are designed, the input terminal D of the first switch element Q1 is connected to the first electrode plate of the energy storage capacitor, the output terminal Q of the first switch element Q1 is connected to the anode of the laser diode LD1 and the input terminal D of the second switch element Q2, the output terminal Q of the second switch element Q2 is grounded, and control terminals S of the first switch element Q1 and the second switch element are both configured to be connected to an external controller or a controller of the built-in laser diode drive circuit 1. Herein, the laser diode drive circuit 1 further includes a driver, the first switch element Q1 is connected to the controller via the driver, the second switch element Q2 is connected to the controller via the driver, the controller (not shown in the figure) can send a trigger signal to the driver, and the driver drives the switching between the turn-on state and the turn-off state of the first switch element Q1 and the second switch element Q2 based on the received trigger signal. When the energy storage element C1 is discharged, the controller sends a trigger signal to the control terminal S of the first switch element Q1 via the driver, to trigger the turn-on of the first switch element Q1, so that the energy released by the energy storage element C1 flows through the first switch element Q1 to drive the laser diode LD1 to emit a laser beam to the target detected object; or when the energy storage element C1 is charged, the controller sends a trigger signal to the control terminal S of the second switch element Q2 via the driver, to trigger the turn-on of the second switch element Q2, so that the leakage current flowing through the parasitic capacitance of the first switch element Q1 flows to the ground terminal via the second switch element Q2, thereby effectively preventing light interference caused because the leakage current drives the laser diode LD1 to emit a laser beam.

Herein, the driver is a device that drives the switching between the turn-on state and the turn-off state of the first switch element Q1 (or the second switch element Q2), and the driver may include but not limited to a driver chip.

The controller is configured to send a first trigger signal TX_EN_H (that is, an electrical signal for controlling the switching between the turn-on state and the turn-off state of the first switch element Q1) to the control terminal S of the first switch element Q1 via the driver.

When the controller sends, to the control terminal S of the first switch element Q1 via the driver, the first trigger signal TX_EN_H switched from a low level to a high level, the high-level first trigger signal TX_EN_H enables the input terminal D and the output terminal Q of the first switch element Q1 to be connected (that is, the first switch element Q1 is turned on), and the first switch element Q1 is turned on, so that the energy released by the energy storage element C1 flows from the input terminal D of the first switch element Q1 to the output terminal Q of the first switch element Q1 and finally to the laser diode LD1, thereby driving the laser diode LD1 to emit the laser beam to the target detected object; or similarly, when the controller sends, to the control terminal S of the first switch element Q1 via the driver, the first trigger signal TX_EN_H switched from a high level to a low level, the low-level first trigger signal TX_EN_H enables the input terminal D and the output terminal Q of the first switch element Q1 to be disconnected (that is, the first switch element Q1 is turned off).

The controller is further configured to send a second trigger signal TX_EN_L (that is, an electrical signal for controlling the switching between the turn-on state and the turn-off state of the second switch element Q2) to the control terminal S of the second switch element Q2 via the driver.

When the controller sends, to the control terminal S of the second switch element Q2 via the driver, the second trigger signal TX_EN_L switched from a low level to a high level, the high-level second trigger signal TX_EN_L enables the input terminal D and the output terminal Q of the second switch element Q2 to be connected (that is, the second switch element Q2 is turned on), and the second switch element Q2 is turned on, so that the leakage current flowing through the parasitic capacitance of the first switch element Q1 flows from the input terminal D of the second switch element Q2 to the output terminal Q of the second switch element Q2 and finally to the foregoing ground terminal, thereby effectively preventing light interference caused because the leakage current drives the laser diode LD1 to emit the laser beam; or similarly, when the controller sends, to the control terminal S of the second switch element Q2 via the driver, the second trigger signal TX_EN_L switched from a high level to a low level, the low-level second trigger signal TX_EN_L enables the input terminal D and the output terminal Q of the second switch element Q2 to be disconnected (that is, the second switch element Q2 is turned off).

The control terminal S of the first switch element Q1 and the control terminal S of the second switch element Q2 can receive the foregoing first trigger signal TX_EN_H and second trigger signal TX_EN_L via the same driver, and certainly, the control terminal S of the first switch element Q1 and the control terminal S of the second switch element Q2 can receive the foregoing first trigger signal TX_EN_H and second trigger signal TX_EN_L via different drivers.

Further, there may be many exemplary manifestation forms of implementing switching between the turn-on state and the turn-off state of the first switch element Q1 and the second switch element Q2 via electronic control. For example, the first switch element Q1 and the second switch element Q2 can both be PMOS transistors, a source of the PMOS transistor is the input terminal D, a drain of the PMOS transistor is the output terminal Q, and a gate of the PMOS transistor is the control terminal S. Certainly, both the first switch element Q1 and the second switch element Q2 can also be NPN triodes, a collector of the NPN triode is the input terminal D, an emitter of the NPN triode is the output terminal Q, and a base of the NPN triode is the control terminal S. In order that the first switch element Q1 is quickly turned on under action of the foregoing first trigger signal TX_EN_H and the second switch element Q2 is quickly turned on under action of the second trigger signal TX_EN_L, the first switch element Q1 and the second switch element Q2 are both designed to be NMOS transistors, a drain of the NMOS transistor is the input terminal D, a source of the NMOS transistor is the output terminal Q. and a gate of the NMOS transistor is the control terminal S. In this design, both the first switch element Q1 and the second switch element Q2 use the design of NMOS transistors, so that the first switch-element and the second switch element Q2 are turned on at a greater speed, and the laser diode LD1 can be more quickly driven to emit the laser beam to the target detected object. In some embodiments, the first switch element Q1 is a gallium nitride NMOS transistor. For example, the first switch element Q1 may be selected from a 30 A-40 A gallium nitride NMOS transistor to withstand a larger surge current. The second switch element Q2 can be a low-power or conventional 3 A-5 A gallium nitride NMOS transistor.

Figure 3:
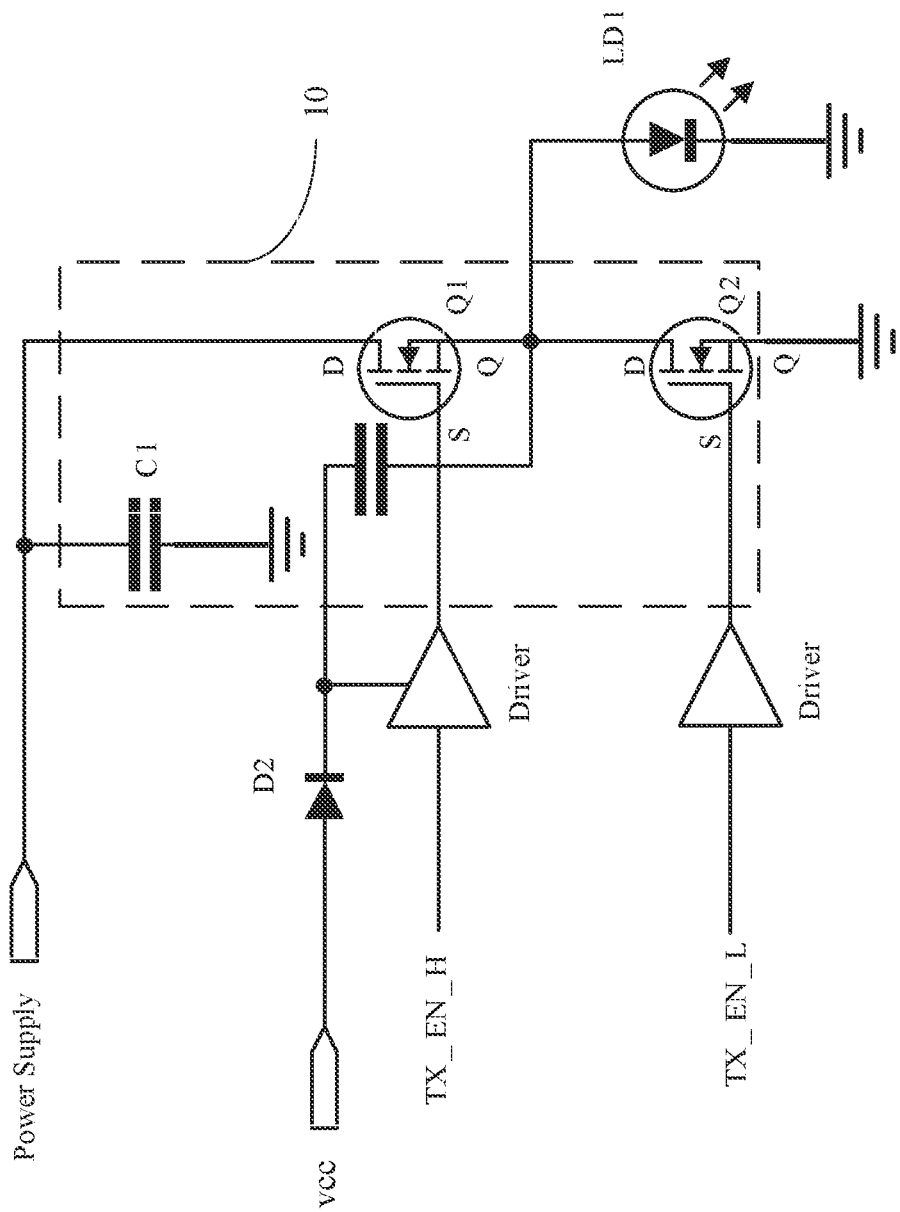
FIG. 3 is a schematic circuit diagram of a laser diode drive circuit according to another embodiment of this application.

As shown in FIG. 3, in an embodiment, the laser diode drive circuit 1 further includes a bootstrap capacitor C2, a first electrode plate of the bootstrap capacitor C2 is configured to be connected to a drive power supply VCC and a driver of the laser diode drive circuit 1, and a second electrode plate of the bootstrap capacitor C2 is connected to the input terminal D of the second switch element Q2. When the second switch element Q2 is turned on, the second electrode plate of the bootstrap capacitor C2 is grounded via the second switch element Q2, and the drive power supply VCC can charge the bootstrap capacitor C2 at this time.

Further, the laser diode drive circuit 1 further includes a second diode D2, an anode of the second diode D2 is configured to be connected to the drive power supply VCC, and a cathode of the second diode D2 is connected to the first electrode plate of the bootstrap capacitor C2. When the first switch element Q1 is turned on, a voltage of the second electrode plate of the bootstrap capacitor C2 is raised, and because the bootstrap capacitor C2 has a characteristic that a voltage across the first electrode plate and the second electrode plate cannot be abruptly changed (that is, a voltage difference between the first electrode plate and the second electrode plate of the bootstrap capacitor C2 cannot be changed within short time), the voltage of the first electrode plate of the bootstrap capacitor C2 is also raised. Because the first electrode plate of the bootstrap capacitor C2 is connected to the driver of the laser diode drive circuit 1, the voltage provided by the bootstrap capacitor C2 to the driver of the laser diode drive circuit 1 is increased. With the designed second diode D2, the voltage of the bootstrap capacitor C2 can be effectively prevented from being applied reversely to the drive power supply VCC.

As shown in FIG. 4 to FIG. 8, in consideration that there are many ways for the external power supply to charge the energy storage capacitor. For example, the external power supply can continuously charge the energy storage capacitor or intermittently charge the energy storage capacitor, and the external power supply can continuously or intermittently charge the energy storage capacitor via pressing or electronic control. The laser diode drive circuit 1 also includes an energy charging circuit 20, the external power supply continuously or intermittently charges the energy storage capacitor via the energy charging circuit 20, and a specific circuit structure of the energy charging circuit 20 can be but not limited to the following several embodiments.

Figure 4:
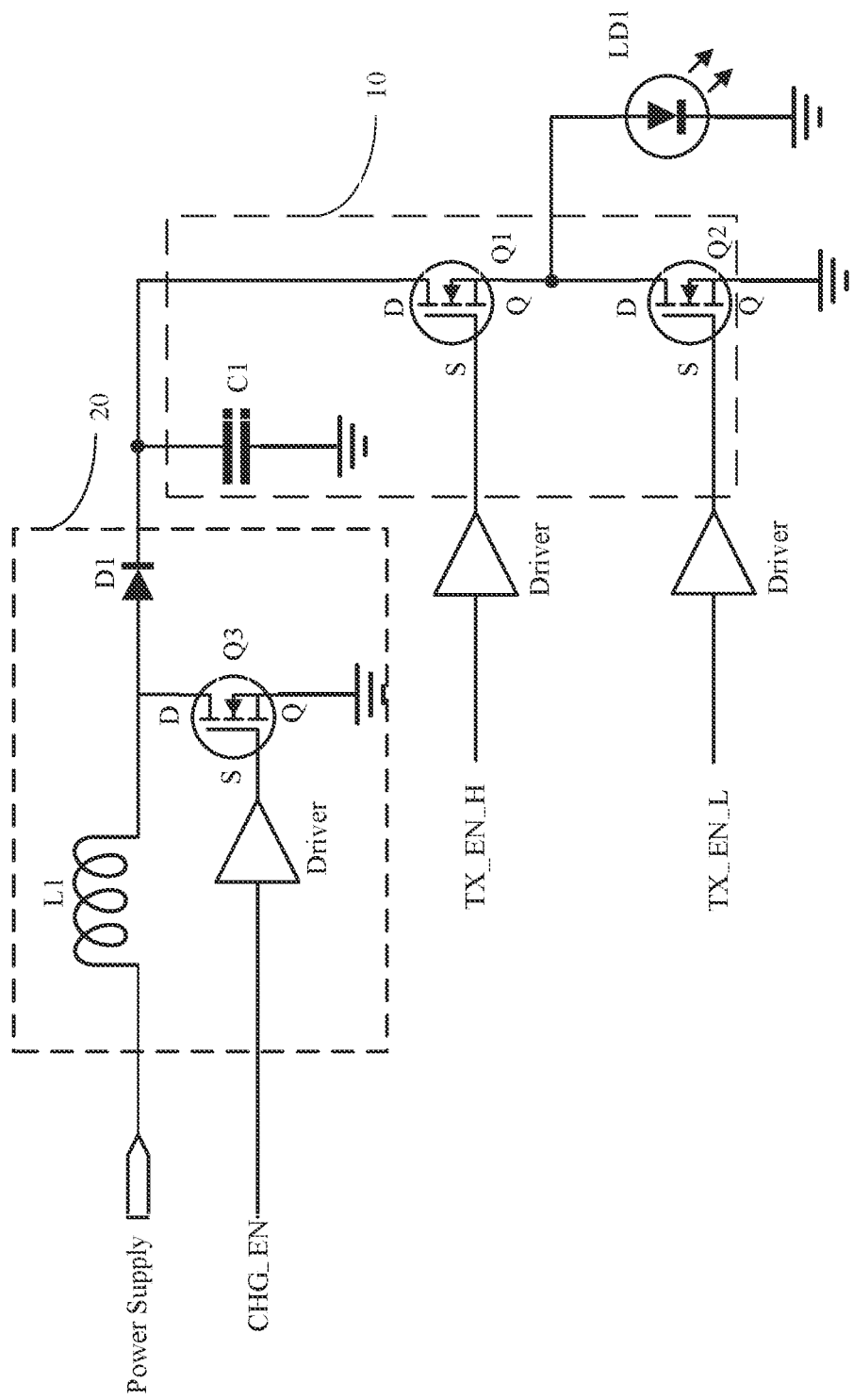
FIG. 4 is a schematic circuit diagram of a laser diode drive circuit according to another embodiment of this application.

A shown in FIG. 4, in an embodiment, the energy charging circuit 20 includes an energy storage inductor L1, a first diode D1 and a third switch element Q3, a first terminal of the energy storage inductor L1 is configured to be connected to an external power supply, a second terminal of the energy storage inductor L1 is connected to the anode of the first diode D1 and connected to the first electrode plate of the energy storage capacitor via the cathode of the first diode D1, and the second terminal of the energy storage inductor L1 is further grounded via the third switch element Q3. The third switch element Q3 has an input terminal D, an output terminal Q, and a control terminal S. For example, the third switch element Q3 can be, but not limited to, an NMOS transistor, a PMOS transistor, an NPN triode, or a PNP triode. When the third switch element Q3 is the NMOS transistor, a drain of the NMOS transistor is the input terminal D, a source of the NMOS transistor is the output terminal Q. and a gate of the NMOS transistor is the control terminal S. The controller is connected to the control terminal S of the third switch element Q3 via the driver, the controller is configured to send the third trigger signal CHG_EN to the control terminal of the third switch element Q3 via the driver, and the third trigger signal CHG_EN can be understood as an electrical signal for implementing dynamic adjustment of luminous power of the laser diode LD1. When the controller sends, to the control terminal S of the third switch element Q3 via the driver, the third trigger signal CHG_EN switched from a low level to a high level, the high-level third trigger signal CHG_EN enables the input terminal D and the output terminal Q of the third switch element Q3 to be connected (that is, the third switch element Q3 is turned on), and the anode of the first diode D1 is grounded through the third switch element Q3. At this time, the external power supply charges the energy storage inductor L1, and therefore, more energy is continuously stored in the energy storage inductor L1. The longer the turn-on time of the third switch element Q3, the more the energy stored in the energy storage inductor L1.

When the controller sends, to the control terminal S of the third switch element Q3 via the driver, the third trigger signal CHG_EN switched from a high level to a low level, the low-level third trigger signal CHG_EN enables the input terminal D and the output terminal Q of the third switch element Q3 to be disconnected (that is, the third switch element Q3 is turned off), the anode of the first diode D1 is connected to the external power supply via the energy storage inductor L1, and the cathode of the first diode D1 is grounded via the energy storage capacitor. At this time, the first diode D1 is in the forward turn-on state, and the energy storage inductor L1 releases energy to the energy storage capacitor via the first diode D1. That is, after the third switch element Q3 is turned off, the energy storage inductor L1 transfers, to the energy storage capacitor, the energy stored when the third switch element Q3 is turned on. The third trigger signal CHG_EN sent by the controller controls the third switch element Q3 to be turned on or off via the driver, so that the external power supply intermittently charges the energy storage capacitor. It can be understood that width of the third trigger signal CHG_EN sent by the controller is designed to be adjustable, to implement dynamic adjustment of the voltage across the first electrode plate and the second electrode plate of the energy storage capacitor, so that the luminous power of the laser diode LD1 is dynamically adjustable.

Figure 5:
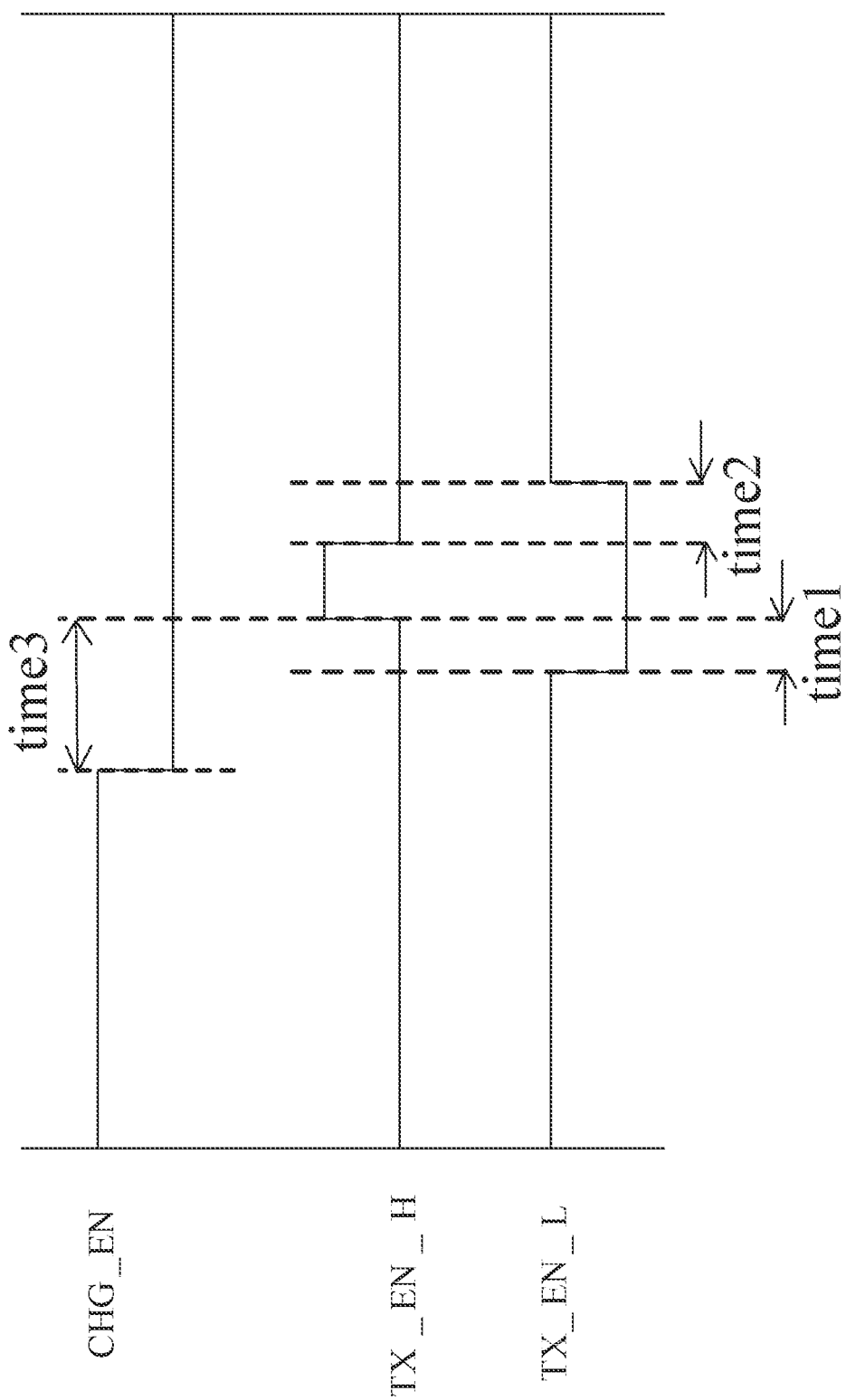
FIG. 5 is a sequence diagram of a first trigger signal, a second trigger signal, and a third trigger signal according to an embodiment of this application.

FIG. 5 is a control sequence diagram of a first trigger signal TX_EN_H, a second trigger signal TX_EN_L, and a third trigger signal CHG_EN according to an embodiment of this application. In consideration that the first switch element Q1 and the second switch element Q2 are switched between the turn-on state and the turn-off state under the action of the first trigger signal TX_EN_H and the second trigger signal TX_EN_L, to prevent a "straight-through phenomenon" of the first switch element Q1 and the second switch element Q2 (that is, a phenomenon that the first switch element Q1 and the second switch element Q2 are in the turn-on state simultaneously under the action of the first trigger signal TX_EN_H and the second trigger signal TX_EN_L), when the energy storage capacitor is charged, the voltage across the first electrode plate and the second electrode plate of the energy storage capacitor can be raised to a preset voltage (for example, a rated voltage); and when the energy storage capacitor is discharged, the laser diode LD1 can emit a laser beam to the target detected object based on preset power (for example, rated power), "first dead time time1" (that is, a time interval during which the first trigger signal TX_EN_H is switched from a low level to a high level until the first switch element Q1 is in the turn-on state) needs to be reserved for the first switch element Q1, "second dead time time1" (that is, a time interval during which the second trigger signal TX_EN_L is switched from a low level to a high level until the second switch element Q2 is in the turn-on state) also needs to be reserved for the second switch element Q2, and the foregoing time interval usually needs to be greater than 50 nanoseconds.

In consideration that after the third switch element Q3 is in the turn-off state, the energy storage inductor L1 releases energy to the energy storage capacitor via the first diode D1 (that is, to charge the energy storage capacitor), and it takes some time to charge the energy storage capacitor. To ensure that the energy storage inductor L1 can release enough energy to the energy storage capacitor via the first diode D1, when the energy storage capacitor is discharged, the energy released by the energy storage capacitor can flow through the first switch element Q1 to drive the laser diode LD1 to emit the laser beam to the target detected object, and therefore, "third dead time time3" needs to be set for the third switch element Q3 (that is, a time interval during which the third trigger signal CHG_EN is switched from a high level to a low level until the first trigger signal TX_EN_H is switched from a low level to a high level), and the third dead time time3 is longer than time required by the energy storage inductor L1 to charge the energy storage capacitor via the first diode D1.

Figure 6:
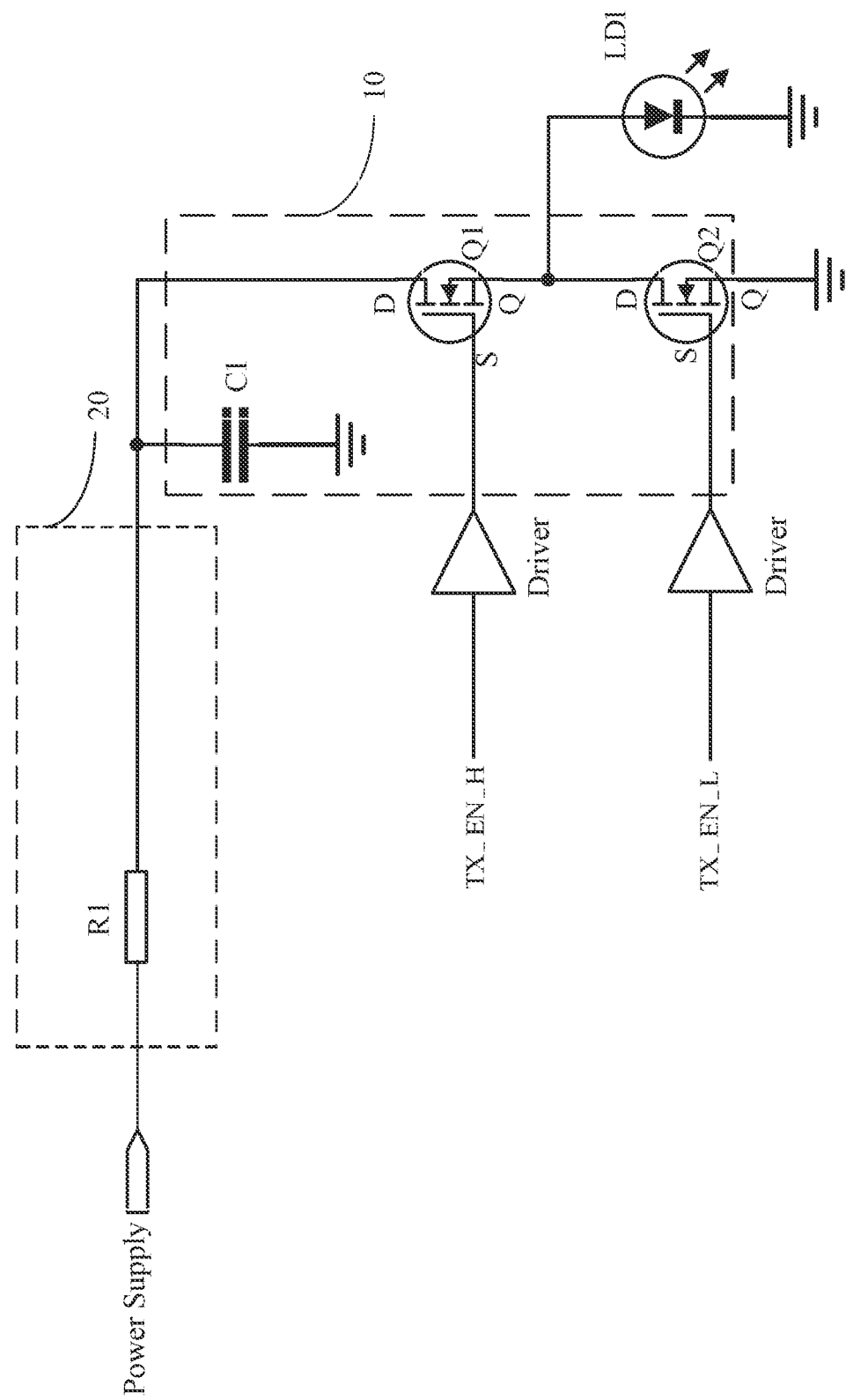
FIG. 6 is a schematic circuit diagram of a laser diode drive circuit according to still another embodiment of this application.

As shown in FIG. 6, in another embodiment, the energy charging circuit 20 includes a current limiting resistor R1, a first terminal of the current limiting resistor R1 is configured to be connected to the external power supply, and a second terminal of the current limiting resistor R1 is connected to the first electrode plate of the energy storage capacitor. With the current limiting resistor R1 designed, the current limiting resistor R1 can limit the current output by the external power supply, which can effectively prevent a large current from flowing through the energy storage capacitor, so that the external power supply continuously charges the energy storage capacitor. In this case, a final voltage of the energy storage capacitor is equal to a voltage of the external power supply.

Figure 7:
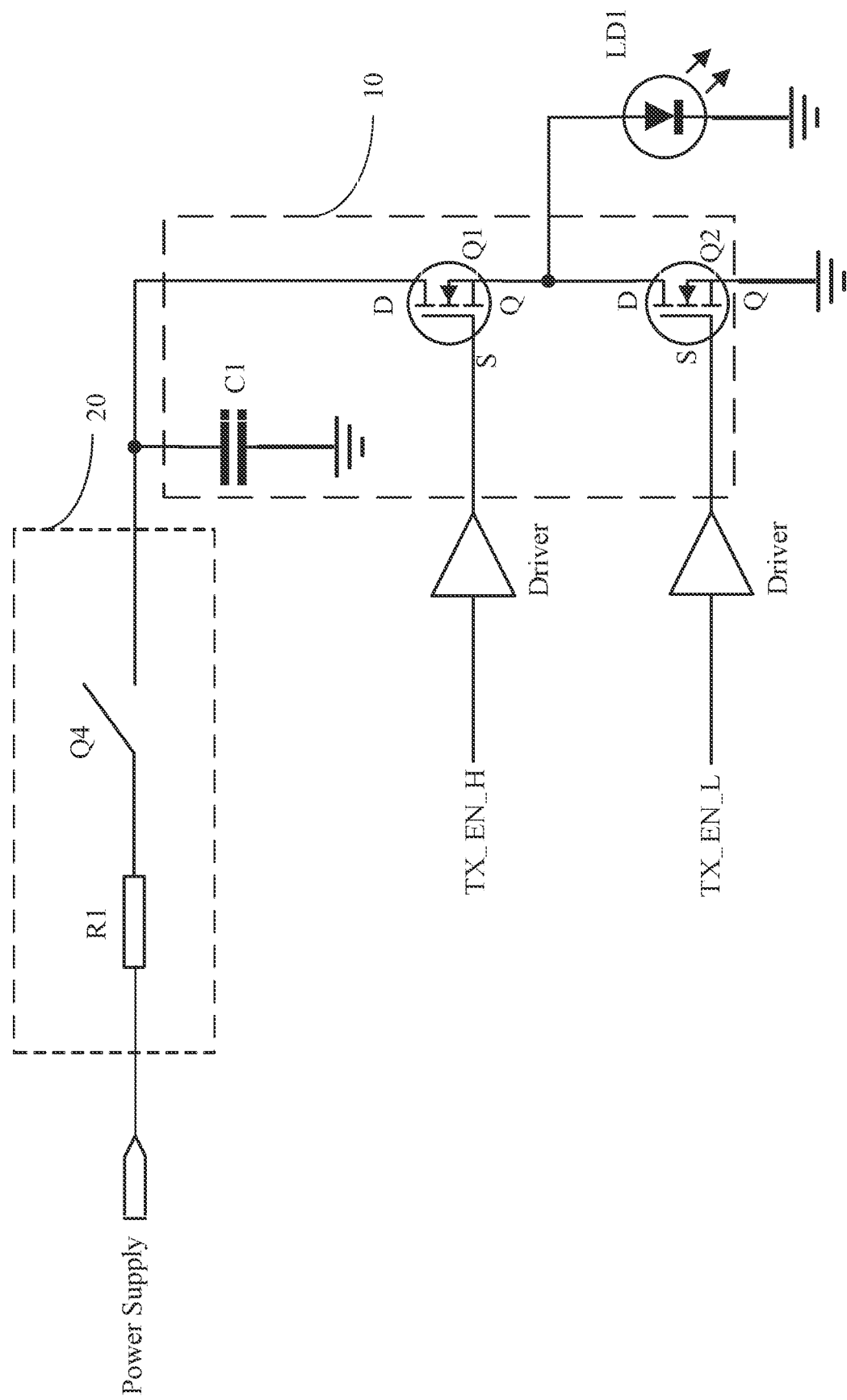
FIG. 7 is a schematic circuit diagram of a laser diode drive circuit according to yet another embodiment of this application.

As shown in FIG. 7, in another embodiment, the energy charging circuit 20 includes a current limiting resistor R1 and a fourth switch element Q4, a first terminal of the current limiting resistor R1 is configured to be connected to an external power supply, and a second terminal of the current limiting resistor R1 is connected to the first electrode plate of the energy storage capacitor via the fourth switch element Q4. The fourth switch element Q4 has a turn-on state and a turn-off state. When the fourth switch element Q4 is in the turn-on state, the current output by the external power supply flows through the current limiting resistor R1 and the fourth switch element Q4 in sequence to the first electrode plate of the energy storage capacitor, thereby continuously charging the energy storage capacitor. When the fourth switch element Q4 is in the turn-off state, the external power supply stops supplying power to the energy storage capacitor. In this case, turn-on duration of the fourth switch element Q4 can be controlled to control the energy provided by the external power supply to the energy storage capacitor, so that emission power of the laser diode LD1 can be adjusted. The fourth switch element Q4 may be, but not limited to, a single-pole single-throw switch, a triode, or a field effect transistor.

Figure 8:
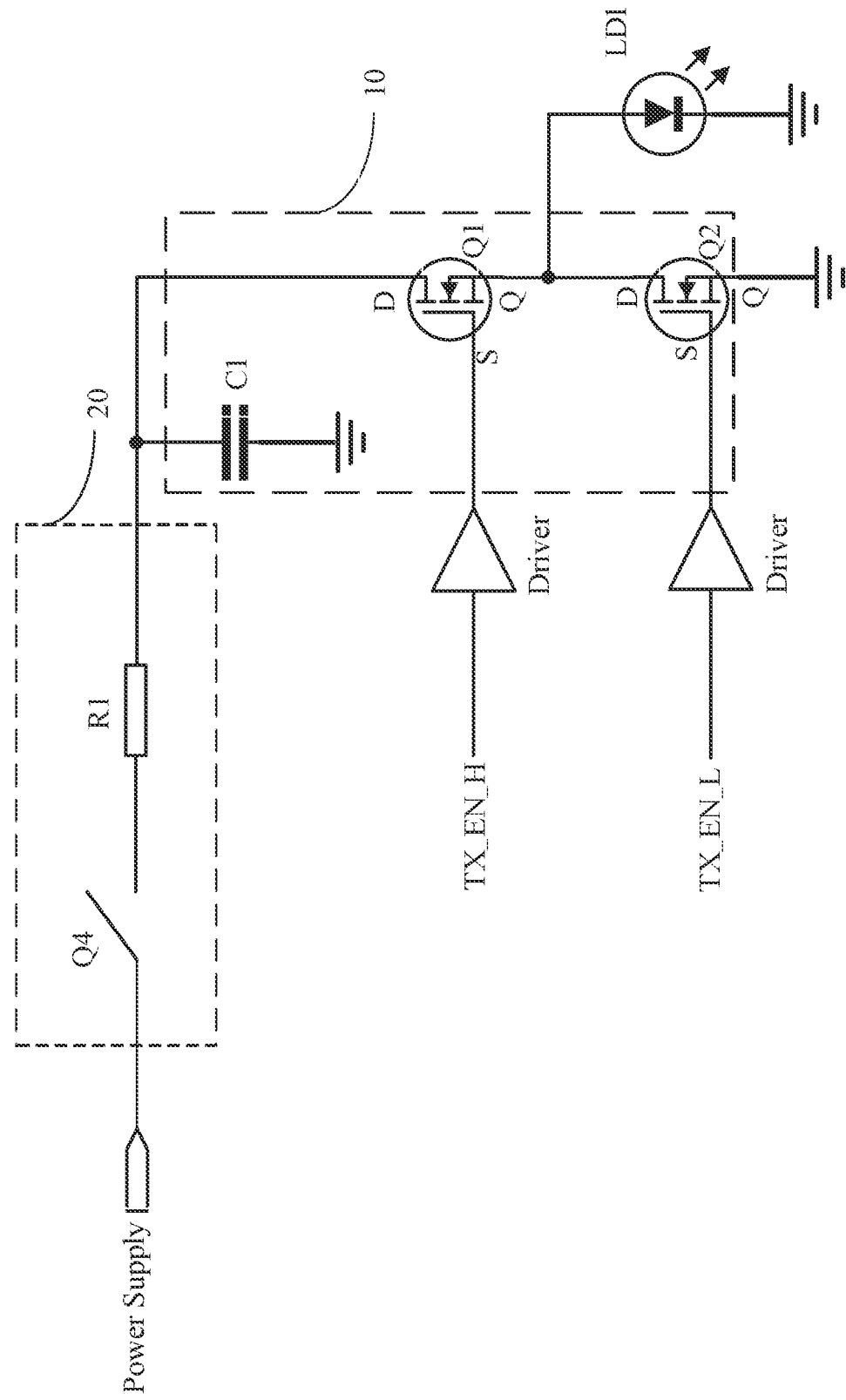
FIG. 8 is a schematic circuit diagram of a laser diode drive circuit according to still yet another embodiment of this application.

As shown in FIG. 8, in another embodiment, the energy charging circuit 20 includes a current limiting resistor R1 and a fourth switch element Q4, a first terminal of the fourth switch element Q4 is configured to be connected to the external power supply, and a second terminal of the fourth switch element Q4 is connected to the first electrode plate of the energy storage capacitor via the current limiting resistor R1. The fourth switch element Q4 has a turn-on state and a turn-off state. When the fourth switch element Q4 is in the turn-on state, the current output by the external power supply flows through the fourth switch element Q4 and the current limiting resistor R1 in sequence to the first electrode plate of the energy storage capacitor, thereby continuously charging the energy storage capacitor. When the fourth switch element Q4 is in the turn-off state, the external power supply stops supplying power to the energy storage capacitor. In this case, turn-on duration of the fourth switch element Q4 can be controlled to control the energy provided by the external power supply to the energy storage capacitor, so that emission power of the laser diode LD1 can be adjusted. The fourth switch element Q4 may be, but not limited to, a single-pole single-throw switch, a triode, or a field effect transistor.

A second aspect of this application provides a LiDAR, where the LiDAR (not shown in the figure) includes a laser beam detection circuit (not shown in the figure) and the foregoing laser diode drive circuit 1, and the laser beam detection circuit is capable of receiving a laser beam that is emitted by the laser diode drive circuit 1 and that is reflected by a target detected object. In this design, the LiDAR having the foregoing laser diode drive circuit 1 can ensure that a leakage current is released to a ground during charging of the energy storage element C1, thereby effectively preventing the light interference caused because the leakage current drives the laser diode LD1 to emit the laser beam to the target detected object.

The laser beam detection circuit analyzes and processes a laser beam reflected by the target detected object to obtain position information of the target detected object. The LiDAR can also include a laser beam receiving lens, and the laser beam detection circuit can include a laser beam detector. The laser beam receiving lens can be on a light-incident side of the laser beam detector and is configured to receive a reflected laser beam and focus the reflected laser beam on the laser beam detector. The LiDAR can be applied to all fields of detection of the position information of target detected objects. For example, the LiDAR can be applied to the field of cleaning technologies, especially widely used in a cleaning device such as a sweeping robot.

Technical features in the foregoing embodiments can be randomly combined. For brevity, not all possible combinations of the technical features in the foregoing embodiments are described. However, so long as the combinations of these technical features are not contradictory, the combinations should be considered as falling within the range recorded in this specification.

The invention claimed is:
1. A laser diode drive circuit, comprising:
a laser diode, wherein a cathode of the laser diode is grounded; and a charging and discharging circuit in a one-to-one correspondence with the laser diode, wherein the charging and discharging circuit comprises an energy storage element, a first switch element, and a second switch element, the energy storage element is connected to an anode of the laser diode via the first switch element, and the energy storage element is grounded via the first switch element and the second switch element in sequence, wherein when the energy storage element is charged, the first switch element is turned off and the second switch element is turned on, so that leakage current through the first switch element is discharged via the second switch element; and when the energy storage element is discharged, the first switch element is turned on and the second switch element is turned off, so that the energy released from the energy storage element drives the laser diode to emit laser through the first switch element;

wherein the energy storage element comprises an energy storage capacitor, a first electrode plate of the energy storage capacitor is connected to the first switch element, and a second electrode plate of the energy storage capacitor is grounded; and wherein the first switch element and the second switch element each comprise an input terminal, an output terminal, and a control terminal, the input terminal of the first switch element is connected to the first electrode plate of the energy storage capacitor, the output terminal of the first switch element is connected to the anode of the laser diode and the input terminal of the second switch element, the output terminal of the second switch element is grounded, and control terminals of the first switch element and the second switch element are configured to be connected to an external controller or a built-in controller of the laser diode drive circuit.

2. The laser diode drive circuit according to claim 1, wherein multiple laser diodes form multiple cathode-shared lasers, and each cathode-shared laser comprises multiple cathode-shared laser diodes.

3. The laser diode drive circuit according to claim 1, wherein the first switch element and the second switch element are both NMOS transistors, a drain of each NMOS transistor is the input terminal, a source of each NMOS transistor is the output terminal, and a gate of each NMOS transistor is the control terminal.

4. The laser diode drive circuit according to claim 3, wherein the first switch element is a gallium nitride NMOS transistor.

5. The laser diode drive circuit according to claim 3, further comprising:
a bootstrap capacitor, wherein a first electrode plate of the bootstrap capacitor is configured to be connected to a drive power supply, and a second electrode plate of the bootstrap capacitor is connected to the input terminal of the second switch element.

6. The laser diode drive circuit according to claim 1, further comprising an energy charging circuit, wherein the energy charging circuit comprises an energy storage inductor, a first diode, and a third switch element, a first terminal of the energy storage inductor is configured to be connected to an external power supply, a second terminal of the energy storage inductor is connected to the anode of the first diode and connected to the first electrode plate of the energy storage capacitor via the cathode of the first diode, and the second terminal of the energy storage inductor is further grounded via the third switch element.

7. The laser diode drive circuit according to claim 1, further comprising an energy charging circuit, wherein the energy charging circuit comprises a current limiting resistor, a first terminal of the current limiting resistor is configured to be connected to an external power supply, and a second terminal of the current limiting resistor is connected to the first electrode plate of the energy storage capacitor.

8. The laser diode drive circuit according to claim 1, further comprising an energy charging circuit, wherein the energy charging circuit comprises a current limiting resistor and a fourth switch element, wherein a first terminal of the current limiting resistor is configured to be connected to an external power supply, and a second terminal of the current limiting resistor is connected to the first electrode plate of the energy storage capacitor via the fourth switch element; or the first terminal of the fourth switch element is configured to be connected to the external power supply, and the second terminal of the fourth switch element is connected to the first electrode plate of the energy storage capacitor via the current limiting resistor.

* * * * *